United States Patent [19]

Kuruma et al.

[11] Patent Number: 5,100,739
[45] Date of Patent: Mar. 31, 1992

[54] SEPARATING SHEET PROVIDED WITH A PLURALITY OF PLATING LAYERS, EXCELLENT IN STRIPPABILITY AND HAVING A HIGH HARDNESS

[75] Inventors: Kiyoshi Kuruma; Masaki Abe; Hiroshi Kagechika; Shinichi Kagaya, all of Tokyo, Japan

[73] Assignee: NKK Corporation, Tokyo, Japan

[21] Appl. No.: 605,261

[22] Filed: Oct. 29, 1990

[30] Foreign Application Priority Data

Apr. 26, 1990 [JP] Japan .................. 2-111479

[51] Int. Cl.$^5$ .............................................. B32B 15/08
[52] U.S. Cl. .................................. 428/614; 428/626; 428/680
[58] Field of Search .............. 428/614, 652, 626, 679, 428/680, 935; 384/908; 252/10, 12.2; 106/38.22, 38.27

[56] References Cited

U.S. PATENT DOCUMENTS

| | | | |
|---|---|---|---|
| 3,421,972 | 1/1969 | Cromwell et al. | 428/626 |
| 3,716,348 | 2/1973 | Perkins | 428/652 |
| 3,756,925 | 9/1973 | Takeuchi et al. | 204/16 |
| 4,222,828 | 9/1980 | Zuurdeeg | 204/16 |
| 4,666,786 | 5/1987 | Yano et al. | 427/438 |
| 4,681,817 | 7/1987 | Shinada | 428/679 |
| 4,728,398 | 3/1988 | Paulet et al. | 204/16 |
| 4,830,889 | 5/1989 | Henry et al. | 427/437 |
| 5,024,900 | 6/1991 | Kuruma et al. | 428/626 |

FOREIGN PATENT DOCUMENTS

55-041259  3/1980  Japan .
58-31292   7/1983  Japan .
60-10816   4/1985  Japan .

OTHER PUBLICATIONS

Brenner, "Electrodeposition of Alloys, Principles and Practice", vol. 1, 1963, (TS 693 B7), pp. 208-223.
Lowenheim, "Modern Electroplating", 1974, (TS 670 E6), 3rd ed. pp. 710-713.

*Primary Examiner*—John Zimmerman
*Attorney, Agent, or Firm*—Frishauf, Holtz, Goodman & Woodward

[57] ABSTRACT

A plated metal sheet provided with a plurality of plating layers, excellent in strippability and having a high hardness, which comprises: a nickel alloy plating layer as a lower layer, having a Vickers hardness of at least 500 Hv, formed on at least one surface of a metal sheet; and a composite metal plating layer as an upper layer, in which fluorocarbon polymer particles are uniformly dispersed, formed on the nickel alloy plating layer as the lower layer. A content of the fluorocarbon polymer particles in the composite metal plating layer as the upper layer is within a range of from 1 to 50 vol. % relative to the composite metal plating layer as the upper layer.

19 Claims, 1 Drawing Sheet

SEPARATING SHEET PROVIDED WITH A PLURALITY OF PLATING LAYERS, EXCELLENT IN STRIPPABILITY AND HAVING A HIGH HARDNESS

FIELD OF THE INVENTION

The present invention relates to a plated metal sheet provided with a plurality of plating layers, excellent in a property permitting stripping of an adhesive adhering onto the surface thereof (hereinafter referred to as "strippability") and having a high hardness.

BACKGROUND OF THE INVENTION

A printed circuit board widely used in an electronic implement comprises, for example, a synthetic resin sheet and a sheet of copper foil bonded onto each of the both surfaces of the synthetic resin sheet through a glass fiber sheet impregnated with an epoxy resin (hereinafter referred to as the "prepreg").

A typical method for manufacturing a printed circuit board is described with reference to FIG. 1. FIG. 1 is a schematic descriptive view illustrating a method for simultaneously manufacturing a plurality of printed circuit boards by the use of a hot press.

First, a sheet of copper foil 10a, a prepreg 9a, a synthetic resin sheet 8, another prepreg 9b and another sheet of copper foil 10b are placed one on the top of the other in this order to prepare a set of laminated sheets 7a. Another set of laminated sheets 7b is prepared in the same manner as described above, and thus a plurality of sets of laminated sheets 7a and 7b are prepared.

The above-mentioned plurality of sets of laminated sheets 7a and 7b are arranged between a pair of pressing portions of a hot press 13, as shown in FIG. 1, i.e., between a lower pressing portion 15 provided on a stand 14, and an upper pressing portion 16 arranged upward the lower pressing portion 15 at a prescribed distance therebetween so as to face same, and are pressed at a prescribed temperature. For the purpose of uniformly pressing each of the plurality of sets of laminated sheets 7a and 7b, there are employed a pair of pressing plates made of steel, i.e., a lower pressing plated 11a and an upper pressing plated 11b, each having a thickness of about 5 to 10 mm, and a plurality of separating sheets made of steel, i.e., a lower separating sheet 12a, an intermediate separating sheet 12b and a lower separating sheet 12c, each having a thickness of about 1 to 2 mm.

A block is thus prepared by placing, from down to top in the following order, on the top of the other, the lower pressing plate 11a, the lower separating sheet 12a, the set of laminated sheets 7a, the intermediate separating sheet 12b, the other set of laminated sheets 7b, the upper separating sheet 12c and the upper pressing plate 11b. A plurality of through-holes 17, 18 are provided at prescribed points on the thus prepared block, and mutual slip between the components of the block is prevented by inserting pins (not shown) into these through-holes 17, 18.

The above-mentioned block is mounted on the lower pressing portion 15 equipped with a heater, provided on the stand 14 of the hot press 13. The hot press 13 is actuated in this state to cause the upper pressing portion 16 equipped with a heater to go down and thus to apply a pressure onto the block at a prescribed temperature. As a result, the epoxy resin impregnated in each of the prepreg 9a and the other prepreg 9b is melted, and this causes the sheet of copper foil 10a and the other sheet of copper foil 10b to be respectively bonded onto the both surfaces of the synthetic resin sheet 8 in the set of laminated sheets 7a, thus forming a printed circuit board. A sheet of copper foil and another sheet of copper foil are also respectively bonded onto the both surfaces of a synthetic resin sheet in the other set of laminated sheets 7b in the same manner as described above, thus forming another printed circuit board.

After the completion of bonding of the sheet of copper foil 10a and the other sheet of copper foil 10b onto the both surfaces of the synthetic resin sheet 8, the hot press 13 is actuated to cause the upper pressing portion 16 to go up to release the pressure on the block, and thus to take out the block from the hot press 13. Then, the above-mentioned pins are removed from the through-holes 17, 18 of the block thus taken out, and the lower pressing plate 11a, the lower separating sheet 12a, the intermediate separating sheet 12b , the upper separating sheet 12c and the upper pressing plate 11b are removed from the block, thereby, simultaneously manufacturing a plurality of printed circuit boards.

The above-mentioned method for simultaneously manufacturing the plurality of printed circuit boards has the following problems: When applying a pressure onto the block by the use of the hot press 13 as described above, part of the melted epoxy resin between the synthetic resin sheet 8, the sheet of copper foil 10a and the other sheet of copper foil 10b is forced out from the edges of these sheets and from the through-holes 17, 18 inserted with the above-mentioned pins, and adheres onto the surfaces of the lower pressing plate 11a, the lower separating sheet 12a, the intermediate separating sheet 12b, the upper separating sheet 12c, and the upper pressing plate 11b.

Adhesion of the epoxy resin onto the surfaces of the lower pressing plate 11a, the lower separating sheet 12a, the intermediate separating sheet 12b, the upper separating sheet 12c and the upper pressing plate 11b causes the following demerits:

(1) It becomes difficult to pull out the pins from the through-holes 17, 18 of the above-mentioned block;

(2) It becomes difficult to remove the lower pressing plate 11a, the lower separating sheet 12a, the intermediate separating sheet 12b, the upper separating sheet 12c and the upper pressing plate 11b from the block;

(3) When applying a pressure onto another block by means of the hot press 13 in the same manner as described above by the use of the lower separating sheet 12a, the intermediate separating sheet 12b and the upper separating sheet 12c, onto the surfaces of which the epoxy resin adheres, flaws are caused on the surface of the copper foil of the resultant printed circuit board by the epoxy resin adhering onto the surfaces of these separating sheets 12a, 12b and 12c.

(4) It is therefore necessary, after the use of the lower separating sheet 12a, the intermediate separating sheet 12b and the upper separating sheet 12c, to always remove the epoxy resin adhering onto the surfaces of these separating sheets 12a, 12b and 12c by means of a metal spatula or a knife;

(5) However, the above-mentioned removing operation of the epoxy resin tends to cause flaws on the surfaces of the lower separating sheet 12a, the intermediate separating sheet 12b and the upper separating sheet 12c;

(6) When applying a pressure onto another block by means of the hot press 13 in the same manner as described above by the use of the lower separating sheet 12a, the intermediate separating sheet 12b and the upper separating sheet 12c, on the surfaces of which the above-mentioned flaws are produced, flaws are caused on the surface of the copper foil of the resultant printed circuit board by the flaws produced on the surfaces of these separating sheets 12a, 12b and 12c; and (7) It is therefore necessary to polish frequently the surfaces of the lower separating sheet 12a, the intermediate separating sheet 12b and the upper separating sheet 12c to made smooth. As a result, these separating sheets 12a, 12b and 12c become thinner and the service lives thereof are reduced.

As a means to solve the above-mentioned problems, there is known a method for preventing adhesion of an epoxy resin onto the surfaces of the lower separating sheet 12a, the intermediate separating sheet 12b and the upper separating sheet 12c by covering the surfaces of these separating sheets 12a, 12b and 12c with a fluorocarbon polymer film (hereinafter referred to as the "prior art 1").

However, the prior art 1 has the following defects:

(A) Each time a pressure is applied onto the block by the use of the hot press 13, it is necessary to replace the used fluorocarbon polymer film with a new one, this resulting in more complicated operations and leading to a higher manufacturing cost; and (B) Even by the use of the above-mentioned fluorocarbon polymer film, it is impossible to completely prevent adhesion of the epoxy resin onto the surfaces of the lower separating sheet 12a, the intermediate separating sheet 12b and the upper separating sheet 12c. More specifically, it is necessary to form holes for inserting the above-mentioned pins also in the fluorocarbon polymer film, and as a result, the epoxy resin flows through the holes in the fluorocarbon polymer film, and the through-holes 17, 18 in these separating sheets 12a, 12b and 12c, and adheres onto the surfaces thereof.

Japanese Utility Model Publication No. 60-10,816 dated Apr. 12, 1985 discloses a mold for forming plastics, rubber or glass, which has on the inner surface thereof a plating layer in which fluorocarbon polymer particles are uniformly dispersed (hereinafter referred to as the "prior art 2").

The prior art 2 further discloses the following:

(a) The plating layer on the inner surface of the mold of the prior art 2 may comprise a nickel-phosphorus alloy; and (b) A fluorocarbon polymer layer may be formed, on the surface of the above-mentioned plating layer, by melting the fluorocarbon polymer particles which are exposed on the surface of the plating layer.

The lower separating sheet 12a, the intermediate separating sheet 12b and the upper separating sheet 12c, which are used when applying the pressure onto the block by the use of the above-mentioned hot press 13, are required to have a Vickers hardness of at least 500 Hv. In the prior art 2, however, no regard is given to the effect of both the phosphorus content in the plating layer and the content of the fluorocarbon polymer particles in the plating layer, exerted on both hardness and strippability of the plating layer, in the case where the plating layer comprises a nickel-phosphorus alloy. In the prior art 2, as a result, it is not ensured that the plating layer is excellent in strippability and has a Vickers hardness of at least 500 Hv.

It is not therefore possible to apply the technical idea of the prior art 2 to the lower separating sheet 12a, the intermediate separating sheet 12b and the upper separating sheet 12c, which are used when applying the pressure onto the block by the use of the hot press 13. Even when the technical idea of the prior art 2 is applied to the lower separating sheet 12a, the intermediate separating sheet 12b and the upper separating sheet 12c to form a plating layer, in which the fluorocarbon polymer particles are uniformly dispersed, on the surfaces of these separating sheets 12a, 12b and 12c, it is not ensured that the thus obtained separating sheets simultaneously satisfy the following two conditions: (1) The separating sheets are excellent in strippability, i.e., they have a strippability sufficient to permit easy removal of the epoxy resin adhering onto the surfaces thereof by the use of a metal spatula or a knife; and (2) The separating sheets have a sufficient hardness, i.e., a Vickers hardness of at least 500 Hv.

Therefore, if the thus obtained separating sheets are used when applying the pressure onto the block by the use of the hot press 13, the following problems may be caused: (a) It is difficult to completely remove the epoxy resin adhering onto the surfaces of the separating sheets even with the use of a metal spatula or a knife; and (b) During the above-mentioned removing operation of the epoxy resin, the metal spatura or the knife may cause deep flaws in the plating layer, and moreover, may cause flaws, not only in the plating layer, but also in the substrate itself, and such flaws in the plating layer and the substrate degrade the quality of the printed circuit board, as described above.

Under such circumstances, there is a strong demand for the development of a plated metal sheet provided with a plurality of plating layers, excellent in strippability and having a high hardness, which is most suitable as a separating sheet to be used when manufacturing a printed circuit board by the use of a hot press, but such a plated metal sheet has not as yet been proposed.

SUMMARY OF THE INVENTION

An object of the present invention is therefore to provide a plated metal sheet provided with a plurality of plating layers, excellent in strippability and having a high hardness, which is most suitable as a separating sheet to be used when manufacturing a printed circuit board by the use of a hot press.

In accordance with one of the features of the present invention, there is provided a plated metal sheet provided with a plurality of plating layers, excellent in strippability and having a high hardness, which comprises:

a nickel alloy plating layer as a lower layer, having a Vickers hardness of at least 500 Hv, formed on at least one surface of a metal sheet; and a composite metal plating layer as an upper layer, in which fluorocarbon polymer particles are uniformly dispersed, formed on said nickel alloy plating layer as the lower layer, a content of said fluorocarbon polymer particles in said composite metal plating layer as the upper layer being within a range of from 1 to 50 vol. % relative to said composite metal plating layer as the upper layer.

DETAILED DESCRIPTION OF PREFERRED EMBODIMENTS

From the above-mentioned point of view, extensive studies were carried out to develop a plated metal sheet provided with a plurality of plating layers, excellent in strippability and having a high hardness, which is most suitable as a separating sheet to be used when manufacturing a printed circuit board by the use of a hot press.

As a result, the following findings were obtained: It is possible to manufacture a plated metal sheet provided with a plurality of plating layers, excellent in strippability and having a high hardness, by forming a nickel alloy plating layer as a lower layer, having a Vickers hardness of at least 500 Hv, on at least one surface of a metal sheet; then forming a composite metal plating layer as an upper layer, in which fluorocarbon polymer particles are uniformly dispersed, on said nickel alloy plating layer as the lower layer; and limiting the content of said fluorocarbon polymer particles in said composite metal plating layer as the upper layer within a range of from 1 to 50 vol. % relative to said composite metal plating layer as the upper layer.

The present invention was made on the basis of the above-mentioned findings. A plated metal sheet provided with a plurality of plating layers, excellent in strippability and having a high hardness of the present invention is described below with reference to the drawings.

Figure 1:
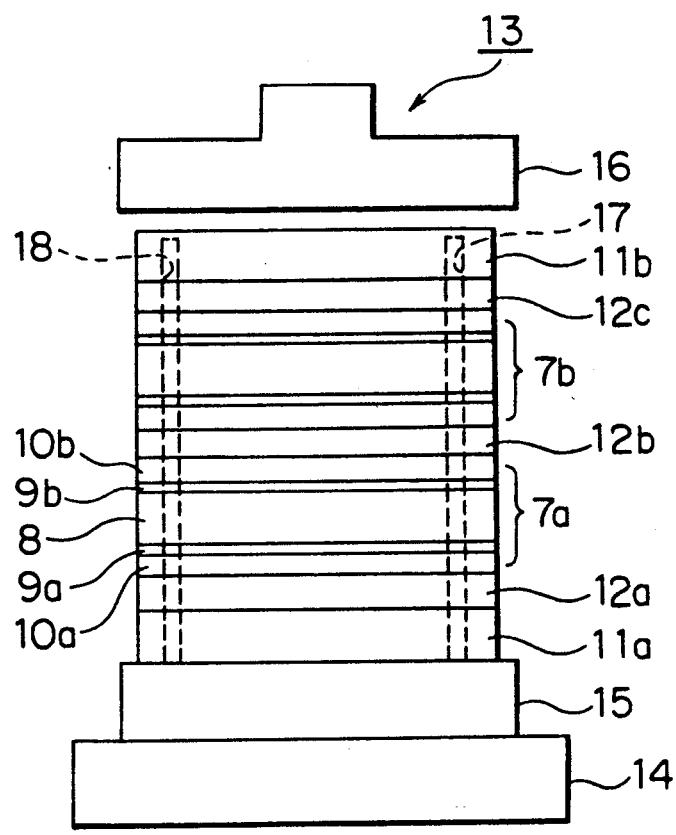
FIG. 1 is a schematic descriptive view illustrating a method for simultaneously manufacturing a plurality of printed circuit boards by the use of a hot press.
Figure 2:
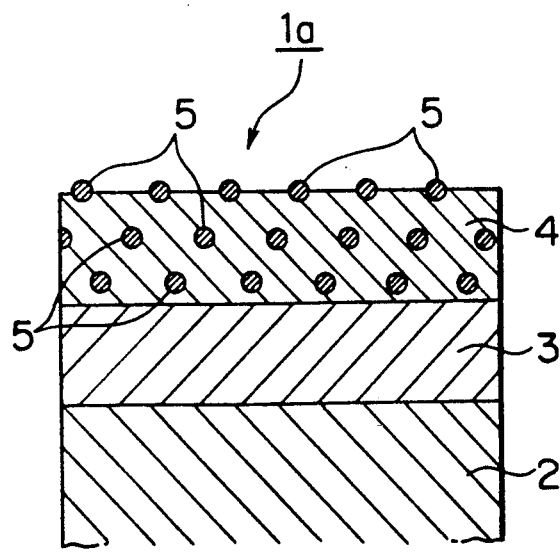
FIG. 2 is a schematic partial vertical sectional view illustrating a first embodiment of the plated metal sheet of the present invention.

FIG. 2 is a schematic partial vertical sectional view illustrating a first embodiment of the plated metal sheet of the present invention.

As shown in FIG. 2, a plated metal sheet 1a of the first embodiment of the present invention comprises a nickel alloy plating layer 3 as a lower layer, formed on at least one surface of a metal sheet 2, and a composite metal plating layer 4 as an upper layer, in which fluorocarbon polymer particles 5 are uniformly dispersed, formed on the nickel alloy plating layer 3 as the lower layer.

The metal sheet 2 comprises steel or an aluminum alloy. Grades of steel which may be used as the metal sheet 2 include, for example, machine structural carbon steel such as JIS S45C, ordinary structural steel such as JIS SS41, austenitic stainless steel such as JIS SUS201, ferritic stainless steel such as JIS SUS405, martensitic stainless steel such as JIS SUS403, and precipitation-hardened stainless steel such as JIS SUS630. Grades of aluminum alloy which may be used as the metal sheet 2 include, for example, aluminum alloy such as JIS 1100 and JIS 3003.

The nickel alloy plating layer 3 as the lower layer covers at least one surface of the metal sheet 2 to prevent the production of flaws on the metal sheet 2 caused by an external force. Therefore, the nickel alloy plating layer 3 as the lower layer must have a Vickers hardness of at least 500 Hv. The nickel alloy plating layer 3 as the lower layer comprises, for example, a nickel-phosphorus alloy or a nickel-boron alloy.

When the nickel alloy plating layer 3 as the lower layer comprises a nickel-phosphorus alloy, a phosphorus content in the nickel alloy plating layer 3 as the lower layer exerts an important effect on hardness of the nickel alloy plating layer 3 as the lower layer. With a phosphorus content in the nickel alloy plating layer 3 as the lower layer of under 1 wt. % relative to the nickel alloy plating layer 3 as the lower layer, it is impossible to impart a Vickers hardness of at least 500 Hv to the nickel alloy plating layer 3 as the lower layer. With a phosphorus content in the nickel alloy plating layer 3 as the lower layer of over 1.5 wt. % relative to the nickel alloy plating layer 3 as the lower layer, on the other hand, no further improvement of hardness of the nickel alloy plating layer 3 as the lower layer is observed, resulting in an uneconomical increment of the phosphorus content. Furthermore, this increases an internal stress of the nickel alloy plating layer 3 as the lower layer, thus making it easier to cause cracks. The phosphorus content in the nickel alloy plating layer 3 as the lower layer, which comprises nickel-phosphorus alloy, should therefore be limited within a range of from 1 to 15 wt. % relative to the nickel alloy plating layer 3 as the lower layer.

When the nickel alloy plating layer 3 as the lower layer comprises a nickel-boron alloy, a boron content in the nickel alloy plating layer 3 as the lower layer exerts an important effect on hardness of the nickel alloy plating layer 3 as the lower layer. With a boron content in the nickel alloy plating layer 3 as the lower layer of under 1 wt. % relative to the nickel alloy plating layer 3 as the lower layer, it is impossible to impart a Vickers hardness of at least 500 Hv to the nickel alloy plating layer 3 as the lower layer. With a boron content in the nickel alloy plating layer 3 as the lower layer of over 15 wt. % relative to the nickel alloy plating layer 3 as the lower layer, on the other hand, no further improvement of hardness of the nickel alloy plating layer 3 as the lower layer is observed, resulting in an uneconomical increment of the boron content. Furthermore, this increases an internal stress of the nickel alloy plating layer 3 as the lower layer, thus making it easier to cause cracks. The boron content in the nickel alloy plating layer 3 as the lower layer, which comprises nickel-boron alloy, should therefore be limited within a range of from 1 to 15 wt. % relative to the nickel alloy plating layer 3 as the lower layer.

An average thickness of the nickel alloy plating layer 3 as the lower layer exerts an important effect on a protection of the metal sheet 2 against an external force and on a surface roughness of the nickel alloy plating layer 3 as the lower layer. With an average thickness of the nickel alloy plating layer 3 as the lower layer of under 0.1 μm, the metal sheet 2, the surface of which is covered by the nickel alloy plating layer 3 as the lower layer, tends to be easily damaged by an external force, thus making it impossible to sufficiently protect the metal sheet 2. With an average thickness of the nickel alloy plating layer 3 as the lower layer of over 100 μm, on the other hand, the surface of the nickel alloy plating layer 3 as the lower layer is roughened, thus degrading smoothness thereof and leading to an uneconomical increment of the average thickness. The average thickness of the nickel alloy plating layer 3 as the lower layer should therefore be limited within a range of from 0.1 to 100 μm, and more preferably, within a range of from 1 to 20 μm.

The fluorocarbon polymer particles 5 are uniformly dispersed in the composite metal plating layer 4 as the upper layer, formed on the above-mentioned nickel alloy plating layer 3 as the lower layer. The fluorocarbon polymer particles 5 which are exposed on the surface of the composite metal plating layer 4 as the upper layer, permit very easy stripping of an adhesive adhering onto the surface of the composite metal plating layer 4 as the upper layer.

The composite metal plating layer 4 as the upper layer comprises, for example, a metal selected from the group consisting of nickel, cobalt, chromium, zinc, copper and tin. The composite metal plating layer 4 as the upper layer may comprise an alloy of a metal selected from the above-mentioned group. Use of anyone of nickel, a nickel-phosphorus alloy or a nickel-boron alloy as the material for the composite metal plating layer 4 as the upper layer, makes it possible to impart a high hardness and an excellent corrosion resistance to the composite metal plating layer 4 as the upper layer.

A content of the fluorocarbon polymer particles 5 in the composite metal plating layer 4 as the upper layer, exerts an important effect on strippability of the plated metal sheet 1a and on hardness of the composite metal plating layer 4 as the upper layer. With a content of fluorocarbon polymer particles 5 in the composite metal plating layer 4 as the upper layer of under 1 vol. % relative to the composite metal plating layer 4 as the upper layer, it is impossible to impart an excellent strippability to the plated metal sheet 1a. With a content of the fluorocarbon polymer particles 5 in the composite metal plating layer 4 as the upper layer of over 50 vol. % relative to the composite metal plating layer 4 as the upper layer, on the other hand, adhesion of the composite metal plating layer 4 as the upper layer to the nickel alloy plating layer 3 as the lower layer is degraded. Therefore, the content of the fluorocarbon polymer particles 5 in the composite metal plating layer 4 as the upper layer should be limited within a range of from 1 to 50 vol. % relative to the composite metal plating layer 4 as the upper layer.

An average thickness of the composite metal plating layer 4 as the upper layer exerts an important effect on strippability of the plated metal sheet 1a and on surface roughness of the composite metal plating layer 4 as the upper layer. With an average thickness of the composite metal plating layer 4 as the upper layer of under 0.1 μm, part of the surface of the nickel alloy plating layer 3 as the lower layer is exposed without being covered by the composite metal plating layer 4 as the upper layer, resulting from the surface roughness of the nickel alloy plating layer 3 as the lower layer, and as a result, an excellent strippability cannot be imparted to the plated metal sheet 1a. With an average thickness of the composite metal plating layer 4 as the upper layer of over 100 μm, on the other hand, the surface of the composite metal plating layer 4 as the upper layer is roughened, thus degrading smoothness thereof and leading to an uneconomical increment of the average thickness. Therefore, an average thickness of the composite metal plating layer 4 as the upper layer should be limited within a range of from 0.1 to 100 μm, and more preferably, within a range of from 0.5 to 20 μm.

An average particle size of the fluorocarbon polymer particles 5 in the composite metal plating layer 4 as the upper layer, exerts an important effect on 1 strippability of the plated metal sheet 1a. With an average particle size of the fluorocarbon polymer particles 5 of under 0.01 μm, the fluorocarbon polymer particles 5 tend to easily agglomerate in an electroplating bath when electroplating the metal sheet 2, on at least one surface of which the nickel alloy plating layer 3 as the lower layer has been formed, to form the composite metal plating layer 4 as the upper layer on the nickel alloy plating layer 3 as the lower layer. As a result, it becomes difficult to uniformly disperse the fluorocarbon polymer particles 5 in the composite metal plating layer 4 as the upper layer, thus making it impossible to impart an excellent strippability to the plated metal sheet 1a. With an average particle size of the fluorocarbon polymer particles 5 of over 10 μm, on the other hand, the fluorocarbon polymer particles 5 tend to easily settle in an electroplating bath when electroplating the metal sheet 2, on at least one surface of which the nickel alloy plating layer 3 as the lower layer has been formed, to form the composite metal plating layer 4 as the upper layer on the nickel alloy plating layer 3 as the lower layer. It becomes difficult, as a result, to uniformly disperse the fluorocarbon polymer particles 5 in the composite metal plating layer 4 as the upper layer, thus making it impossible to impart an excellent strippability to the plated metal sheet 1a. Therefore, the average particle size of the fluorocarbon polymer particles 5 in the composite metal plating layer 4 as the upper layer should be limited within a range of from 0.01 to 10 μm, and more preferably, within a range of from 0.05 to under 0.3 μm.

The above-mentioned plated metal sheet 1a of the first embodiment of the present invention is manufactured as follows.

First, a metal sheet 2 is electroplated or dipplated in a known nickel alloy electroplating bath or a known nickel alloy dip-plating bath, to form, on at least one surface of the metal sheet 2, a nickel alloy plating layer 3 as a lower layer, as shown in FIG. 2. Then, the metal sheet 2 having the nickel alloy plating layer 3 as the lower layer thus formed on at least one surface thereof, is electroplated or dip-plated in a composite metal electroplating bath or a composite metal dipplating bath, which contains fluorocarbon polymer particles 5 in an amount of from 1 to 100 g/l, to form on the nickel alloy plating layer 3 as the lower layer, a composite metal plating layer 4 as an upper layer, in which the fluorocarbon polymer particles 5 are uniformly dispersed, as shown in FIG. 2. Thus, there is manufactured the plated metal sheet 1a of the first embodiment of the present invention, which comprises the nickel alloy plating layer 3 as the lower layer, formed on at least one surface of the metal sheet 2, and the composite metal plating layer 4 as the upper layer, in which the fluorocarbon polymer particles 5 are uniformly dispersed, formed on the nickel alloy plating layer 3 as the lower layer.

Figure 3:
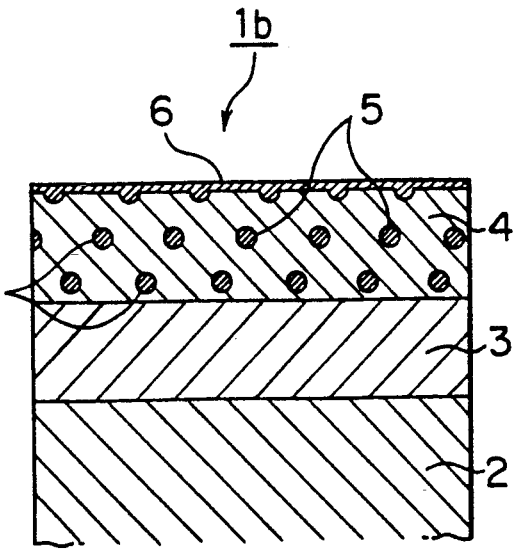
FIG. 3 is a schematic partial vertical sectional view illustrating a second embodiment of the plated metal sheet of the present invention.

FIG. 3 is a schematic partial vertical sectional view illustrating a second embodiment of the plated metal sheet of the present invention.

As shown in FIG. 3, a plated metal sheet 1b of the second embodiment of the present invention comprises a nickel alloy plating layer 3 as a lower layer, formed on at least one surface of a metal sheet 2, and a composite metal plating layer 4 as an upper layer, in which fluorocarbon polymer particles 5 are uniformly dispersed, formed on the nickel alloy plating layer 3 as the lower layer, and the composite metal plating layer 4 as the upper layer has thereon a fluorocarbon polymer layer 6 formed by melting the fluorocarbon polymer particles 5 which are exposed on the surface of the composite metal plating layer 4 as the upper layer.

More particularly, the plated metal sheet 1b of the second embodiment of the present invention is identical with the plated metal sheet 1a of the first embodiment of the present invention except that the composite metal plating layer 4 as the upper layer has thereon the fluorocarbon polymer layer 6 formed by melting the fluorocarbon polymer particles 5 which are exposed on the surface of the composite metal plating layer 4 as the upper layer. The above-mentioned fluorocarbon polymer layer 6 imparts a more excellent strippability to the plated metal sheet 1b.

The plated metal sheet 1b of the second embodiment of the present invention is manufactured by heating the plated metal sheet 1a of the above-mentioned first embodiment of the present invention to a prescribed temperature to melt the fluorocarbon polymer particles 5 which are exposed on the surface of the composite metal plating layer 4 as the upper layer of the plated metal sheet 1a. The above-mentioned heating temperature varies with a chemical composition of the fluorocarbon polymer particles 5. When the fluorocarbon polymer particles 5 comprise, for example, polytetrafluoroethylene, the plated metal sheet 1b of the second embodiment of the present invention is available by heating the plated metal sheet 1a of the above-mentioned first embodiment of the present invention to a temperature within a range of from 300° C. to 400° C.

When the composite metal plating layer 4 as the upper layer of the plated metal sheet 1b of the second embodiment of the present invention comprises a nickel-phosphorus alloy, the above-mentioned heat treatment for melting the fluorocarbon polymer particles 5 which are exposed on the surface of the composite metal plating layer 4 as the upper layer causes uniform precipitation of $Ni_3P$ particles in the composite metal plating layer 4 as the upper layer, and this largely improves a Vickers hardness of the composite metal plating layer 4 as the upper layer.

Now, the plated metal sheet of the present invention is described more in detail by means of examples while comparing with cases for comparison.

EXAMPLE 1

A sheet of ordinary structural steel specified in JIS SS41, having a thickness of 10 mm, was used as the metal sheet. The steel sheet was subjected to a known degreasing treatment and a known pickling treatment to remove rust from the both surfaces thereof. Then, after the removal of rust, the steel sheet was electroplated under the following conditions:

| | | |
|---|---|---|
| (1) | Chemical composition of nickel alloy electroplating bath: | |
| | Nickel sulfate | 240 g/l, |
| | Nickel chloride | 45 g/l, |
| | Boric acid | 30 g/l, and |
| | Phosphorous acid | 35 g/l, |
| (2) | Electric current density | 1.5 A/dm², |
| (3) | Bath temperature | 60° C., |
| (4) | pH value | 2.0, |
| (5) | Electroplating time | 30 minutes, | to form, on each of the both surfaces of the steel sheet, a nickel-phosphorus alloy plating layer as a lower layer, having an average thickness of 10 μm.

Then, the steel sheet having the nickel-phosphorus alloy plating layer as the lower layer thus formed on each of the both surfaces thereof, was electroplated under the following conditions:

| | | |
|---|---|---|
| (a) | Chemical composition of composite metal electroplating bath: | |
| | Nickel sulfamate | 500 g/l, |
| | Nickel chloride | 45 g/l, |
| | Boric acid | 35 g/l, and |
| | Polytetrafluoroethylene particles (average particle size: 0.2 μm) as fluorocarbon polymer particles | 50 g/l, |
| (b) | Electric current density | 1.5 A/dm², |
| (c) | Bath temperature | 40° C., |
| (d) | pH value | 4.2, |
| (e) | Electroplating time | 10 minutes, | to form, on the nickel-phosphorus alloy plating layer as the lower layer formed on each of the both surfaces of the steel sheet, a composite nickel plating layer as an upper layer, having an average thickness of 5 μm, in which the fluorocarbon polymer particles were uniformly dispersed, thereby preparing a sample of the present invention No. 1.

Regarding the sample of the present invention No. 1, the following facts were observed:
 (i) A satisfactory adhesion was ensured between the steel sheet and the nickel-phosphorus alloy plating layer as the lower layer, and between the nickel-phosphorus alloy plating layer as the lower layer and the composite nickel plating layer as the upper layer;
 (ii) The nickel-phosphorus alloy plating layer as the lower layer had no cracks:
 (iii) The nickel-phosphorus alloy plating layer as the lower layer had a phosphorus content of 10 wt. % relative to the nickel-phosphorus alloy plating layer as the lower layer;
 (iv) The nickel-phosphorus alloy plating layer as the lower layer had a Vickers hardness of 700 Hv;
 (v) The composite nickel plating layer as the upper layer had a content of the fluorocarbon polymer particles of 30 vol. % relative to the composite nickel plating layer as the upper layer; and
 (vi) The composite nickel plating layer as the upper layer had a Vickers hardness of 200 Hv.

Then, the sample of the present invention No. 1 was tested for strippability by using same as a separating sheet when manufacturing a printed circuit board by the use of a hot press as follows:

First, a sheet of the sample of the present invention No. 1 as a separating sheet, a sheet of copper foil having a thickness of 50 μm, a sheet of a prepreg having a thickness of 50 μm, a substrate sheet made of epoxy resin having a thickness of 0.5 mm, and another sheet of the sample of the present invention No. 1 as another separating sheet, were placed one on the top of the other in this order to prepare a set of laminated sheets. The thus prepared set of laminated sheets was put on a hot press and was pressed for 5 minutes at a temperature of 175° C. As a result, the substrate sheet and the copper foil were firmly bonded together by the epoxy resin impregnated in the prepreg. Although part of the epoxy resin between the substrate sheet and the copper foil was forced out from the edges of these sheets and adhered onto the surface of the sample of the present invention No. 1, most of the adhering epoxy resin was very easily stripped off from the surface of the sample of the present invention No. 1 without the use of a metal spatura or a knife. Part of the epoxy resin still remaining onto the surface of the sample of the present invention No. 1 without being stripped off therefrom, was easily removed by the use of a metal spatura or a knife. There were observed almost no flaws caused by the use of the spatura or the knife on the nickel-phosphorus alloy plating layer as the lower layer.

EXAMPLE 2

A plated metal sheet identical with the sample of the present invention No. 1 was heated at a temperature of 360° C. for one hour to melt the fluorocarbon polymer particles which were exposed on the surface of each of the composite nickel plating layers as the upper layers to form a fluorocarbon polymer layer having an average thickness of 0.1 μm on each of the composite nickel plating layers as the upper layers, thereby preparing a sample of the present invention No. 2.

Regarding the sample of the present invention No. 2, the following fact was further observed in addition to the above-mentioned facts(i) to (iii), (v) and (vi) as observed in the sample of the present invention No. 1: The nickel-phosphorus alloy plating layer as the lower layer had a Vickers hardness of 1,000 Hv.

It was confirmed that the nickel-phosphorus alloy plating layer as the lower layer of the sample of the present invention No. 2 had a Vickers hardness of 1,000 Hv as described above, because the $Ni_3P$ particles were uniformly precipitated in the nickel-phosphorus alloy plating layer as the lower layer under the effect of the above-mentioned heat treatment.

Then, the sample of the present invention No. 2 was tested for strippability in the same manner as in the sample of the present invention No. 1. As a result, the epoxy resin adhering onto the surface of the sample of the present invention No. 2 was totally stripped off very easily from the surface of the sample of the present invention No. 2 without the use of a metal spatura or a knife.

EXAMPLE 3

A sheet of austenitic stainless steel specified in JIS SUS201, having a thickness of 1 mm, was used as a metal sheet. The stainless steel sheet was subjected to a known degreasing treatment and a known electrolytic pickling treatment, and furthermore, to a nickel strike plating as a pretreatment in a nickel chloride plating bath. Then, the thus pretreated stainless steel sheet was electroplated under the following conditions:

| (1) Chemical composition of nickel alloy electroplating bath: | |
|---|---|
| Nickel sulfate | 240 g/l, |
| Nickel chloride | 45 g/l, |
| Boric acid | 30 g/l, and |
| Phosphorous acid | 35 g/l, |
| (2) Electric current density | 1.5 A/dm², |
| (3) Bath temperature | 60° C., |
| (4) pH value | 2.0, |
| (5) Electroplating time | 30 minutes, | to form, on each of the both surfaces of the stainless steel sheet, a nickel-phosphorus alloy plating layer as a lower layer, having an average thickness of 10 μm.

Then, the stainless steelsheet having the nickel-phosphorus alloy plating layer as the lower layer thus formed on each of the both surfaces thereof, was electroplated under the following conditions:

| (a) Chemical composition of composite metal electroplating bath: | |
|---|---|
| Nickel sulfate | 240 g/l, |
| Nickel chloride | 45 g/l, |
| Boric acid | 30 g/l, |
| Phosphorous acid | 25 g/l, and |
| Polytetrafluoroethylene particles (average particle size: 0.2 μm) as fluorocarbon polymer particles | 30 g/l, |
| (b) Electric current density | 1.5 A/dm², |
| (c) Bath temperature | 60° C., |
| (d) pH value | 2.0, |
| (e) Electroplating time | 10 minutes, | to form, on the nickel-phosphorus alloy plating layer as the lower layer formed on each of the both surfaces of the stainless steel sheet, a composite nickel-phosphorus alloy plating layer as an upper layer, having an average thickness of 5 μm, in which the fluorocarbon polymer particles were uniformly dispersed, thereby preparing a sample of the present invention No. 3.

Regarding the sample of the present invention No. 3, the following facts were observed:
(i) A satisfactory adhesion was ensured between the stainless steel sheet and the nickel-phosphorus alloy plating layer as the lower layer, and between the nickel-phosphorus alloy plating layer as the lower layer and the composite nickel-phosphorus alloy plating layer as the upper layer;
(ii) Both of the composite nickel-phosphorus alloy plating layer as the upper layer and the nickel-phosphorus alloy plating layer as the lower layer had no cracks;
(iii) The nickel-phosphorus alloy plating layer as the lower layer had a phosphorus content of 10 wt. % relative to the nickel-phosphorus alloy plating layer as the lower layer;
(iv) The nickel-phosphorus alloy plating layer as the lower layer had a Vickers hardness of 700 Hv;
(v) The composite nickel-phosphorus alloy plating layer as the upper layer had a phosphorus content of 10 wt. %;
(vi) The composite nickel-phosphorus alloy plating layer as the upper layer had a content of the fluorocarbon polymer particles of 20 vol. % relative to the composite nickel-phosphorus alloy plating layer as the upper layer; and
(vii) The composite nickel-phosphorus alloy plating layer as the upper layer had a Vickers hardness of 400 Hv.

Then, the sample of the present invention No. 3 was tested for strippability in the same manner as in the sample of the present invention No. 1. As a result, most of the epoxy resin adhering onto the surface of the sample of the present invention No. 3 was very easily stripped off from the surface of the sample of the present invention No. 3 without the use of a metal spatura or a knife. Part of the epoxy resin still remaining on the surface of the sample of the present invention No. 3 without being stripped off therefrom, was easily removed by the use of a metal, spatura or a knife. There were observed almost no flaws caused by the use of the spatura or the knife on the nickel-phosphorus alloy plating layer as the lower layer.

EXAMPLE 4

A plated metal sheet identical with the sample of the present invention No. 3 was heated at a temperature of 360° C. for one hour to melt the fluorocarbon polymer particles which were exposed on the surface of each of the composite nickel-phosphorus alloy plating layers as the upper layers to form a fluorocarbon polymer layer having an average thickness of 0.1 μm on each of the composite nickel-phosphorus alloy plating layers as the upper layers, thereby preparing a sample of the present invention No. 4.

Regarding the sample of the present invention No. 4, the following facts were further observed in addition to the above-mentioned facts (i) to (iii), (v) and (vi) as observed in the sample of the present invention No. 3:

(a) The nickel-phosphorus alloy plating layer as the lower layer had a Vickers hardness of 1,000 Hv; and (b) The composite nickel-phosphorus alloy plating layer as the upper layer had a Vickers hardness of 600 Hv.

It was confirmed that each of the nickel-phosphorus alloy plating layer as the lower layer and the composite nickel-phosphorus alloy plating layer as the upper layer of the sample of the present invention No. 4, had a high Vickers hardness as described above, because the $Ni_3P$ particles were uniformly precipitated in each of the nickel-phosphorus alloy plating layer as the lower layer and the composite nickel-phosphorus alloy plating layer as the upper layer under the effect of the above-mentioned heat treatment.

Then, the sample of the present invention No. 4 was tested for strippability in the same manner as in the sample of the present invention No. 1. As a result, the epoxy resin adhering onto the surface of the sample of the present invention No. 4 was totally stripped off very easily from the surface of the sample of the present invention No. 4 without the use of a metal spatura or a knife.

EXAMPLE 5

A sheet of austenitic stainless steel specified in JIS SUS201, having a thickness of 1 mm, was used as the metal sheet. The stainless steel sheet was subjected to a known degreasing treatment and a known electrolytic pickling treatment, and furthermore, to a nickel strike plating as a pretreatment in a nickel chloride plating bath. Then, the thus pretreated stainless steel sheet was dip-plated under the following conditions:

| (1) Chemical composition of nickel alloy dip-plating bath: | |
|---|---|
| Nickel sulfate | 30 g/l, |
| Sodium citrate | 20 g/l, |
| Sodium hydroxide | 40 g/l, and |
| Sodium borohydride | 0.45 g/l, |
| (2) Bath temperature | 90° C., |
| (3) pH value | 14, |
| (4) Dip-plating time | 30 minutes, | to form, on each of the both surfaces of the stainless steel, a nickel-boron alloy plating layer as a lower layer, having an average thickness of 5 μm.

Then, the stainless steel sheet having the nickel-boron alloy plating layer as the lower layer thus formed on each of the both surfaces thereof, was electroplated under the following conditions:

| (a) Chemical composition of composite metal electroplating bath: | |
|---|---|

| -continued | |
|---|---|
| Nickel sulfamate | 500 g/l, |
| Nickel chloride | 45 g/l, |
| Boric acid | 35 g/l, and |
| Polytetrafluoroethylene particles (average particle size: 0.2 μm) as fluorocarbon polymer particles | 50 g/l, |
| (b) Electric current density | 1.5 A/dm², |
| (c) Bath temperature | 40° C., |
| (d) pH value | 4.2, |
| (e) Electroplating time | 10 minutes, | to form, on the nickel-boron alloy plating layer as the lower layer formed on each of the both surfaces of the stainless steel sheet, a composite nickel plating layer as an upper layer, having an average thickness of 5 μm, in which the fluorocarbon polymer particles were uniformly dispersed, thereby preparing a sample of the present invention No. 5.

Regarding the sample of the present invention No. 5, the following facts were observed:

(i) A satisfactory adhesion was ensured between the stainless steel sheet and the nickel-boron alloy plating layer as the lower layer, and between the nickel-boron alloy plating layer as the lower layer and the composite nickel plating layer as the upper layer;

(ii) The nickel-boron alloy plating layer as the lower layer had no cracks;

(iii) The nickel-boron alloy plating layer as the lower layer had a boron content of 3.5 wt. % relative to the nickel-boron alloy plating layer as the lower layer;

(iv) The nickel-boron alloy plating layer as the lower layer had a Vickers hardness of 800 Hv;

(v) The composite nickel plating layer as the upper layer had a content of the fluorocarbon polymer particles of 30 vol. % relative to the composite nickel-boron alloy plating layer as the upper layer; and (vi) The composite nickel plating layer as the upper layer had a Vickers hardness of 200 Hv.

Then, the sample of the present invention No. 5 was tested for strippability in the same manner as in the sample of the present invention No. 1. As a result, most of the epoxy resin adhering onto the surface of the sample of the present invention No. 5 was very easily stripped off from the surface of the sample of the present invention No. 5 without the use of a metal spatula or a knife. Part of the epoxy resin still remaining onto the surface of the sample of the present invention No. 5 without being stripped off therefrom, was easily removed by the use of a metal spatula or a knife. There were observed almost no flaws caused by the use of the spatula or the knife on the nickel-boron alloy plating layer as the lower layer.

EXAMPLE 6

A plated metal sheet identical with the sample of the present invention No. 5 was heated to a temperature of 360° C. for one hour to melt the fluorocarbon polymer particles which were exposed on the surface of each of the composite nickel plating layers as the upper layers to form a fluorocarbon polymer layer having an average thickness of 0.1 μm on each of the composite nickel plating layers as the upper layers, thereby preparing a sample of the present invention No. 6.

Regarding the sample of the present invention No. 6, there were observed the same facts as the above-mentioned facts (i) to (vi) observed in the sample of the present invention No. 5.

Then, the sample of the present invention No. 6 was tested for strippability in the same manner as in the sample of the present invention No. 1. As a result, the epoxy resin adhering onto the surface of the sample of the present invention No. 6 was totally stripped off very easily from the surface of the sample of the present invention No. 6 without the use of a metal spatula or a knife.

EXAMPLE 7

A sheet of aluminum alloy specified in JIS 1100, having a thickness of 1 mm, was used as the metal sheet. The aluminum alloy sheet was subjected to a known degreasing treatment, a known etching treatment by the use of a caustic soda solution, and a known smut removing treatment. In addition, the aluminum alloy sheet was subjected to a nickel strike plating as a pretreatment in a nickel chloride plating bath. Then, the thus pretreated aluminum alloy sheet was electroplated under the following conditions:

| (1) Chemical composition of nickel alloy electroplating bath: | |
|---|---|
| Nickel sulfate | 240 g/l, |
| Nickel chloride | 45 g/l, |
| Boric acid | 30 g/l, and |
| Phosphorous acid | 35 g/l, |
| (2) Electric current density | 1.5 A/dm$^2$, |
| (3) Bath temperature | 60° C., |
| (4) pH value | 2.0, |
| (5) Electroplating time | 30 minutes, | to form, on each of the both surfaces of the aluminum alloy sheet, a nickel-phosphorus alloy plating layer as a lower layer, having an average thickness of 10 μm.

Then, the aluminum alloy sheet having the nickel-phosphorus alloy plating layer as the lower layer thus formed on each of the both surfaces thereof, was dip-plated under the following conditions:

| (a) Chemical composition of composite metal dip-plating bath: | |
|---|---|
| Nickel sulfate | 30 g/l, |
| Sodium citrate | 20 g/l, |
| Sodium hydroxide | 40 g/l, |
| Sodium borohydride | 0.45 g/l, and |
| Polytetrafluoroethylene particles (average particle size: 0.2 μm) as fluorocarbon polymer particles | 50 g/l, |
| (b) Bath temperature | 90° C., |
| (c) pH value | 14, |
| (d) Dip-plating time | 30 minutes, | to form, on the nickel-phosphorus alloy plating layer as the lower layer formed on each of the both surfaces of the aluminum alloy sheet, a composite nickel-boron alloy plating layer as an upper layer, having an average thickness of 5 μm, in which the fluorocarbon polymer particles were uniformly dispersed, thereby manufacturing a sample of the present invention No. 7.

Regarding the sample of the present invention No. 7, the following facts were observed:
(i) A satisfactory adhesion was ensured between the aluminum alloy sheet and the nickel-phosphorus alloy plating layer as the lower layer, and between the nickel-phosphorus alloy plating layer as the lower layer and the composite nickel-boron alloy plating layer as the upper layer;
(ii) Both of the nickel-phosphorus alloy plating layer as the lower layer and the composite nickel-boron alloy plating layer as the upper layer had no cracks;
(iii) The nickel-phosphorus alloy plating layer as the lower layer had a phosphorus content of 10 wt. % relative to the nickel-phosphorus alloy plating layer as the lower layer;
(iv) The nickel-phosphorus alloy plating layer as the lower layer had a Vickers hardness of 700 Hv;
(v) The composite nickel-boron alloy plating layer as the upper layer had a boron content of 3.5 wt. % relative to the composite nickel-boron alloy plating layer as the upper layer;
(vi) The composite nickel-boron alloy plating layer as the upper layer had a content of the fluorocarbon polymer particles of 20 vol. % relative to the composite nickel-boron alloy plating layer as the upper layer; and
(vii) The composite nickel-boron alloy plating layer as the upper layer had a Vickers hardness of 600 Hv.

Then, the sample of the present invention No. 7 was tested for strippability in the same manner as in the sample of the present invention No. 1. As a result, most of the epoxy resin adhering onto the surface of the sample of the present invention No. 7 was very easily stripped off from the surface of the sample of the present invention No. 7 without the use of a metal spatula or a knife. Part of the epoxy resin still remaining on the surface of the sample of the present invention No. 7 without being stripped off therefrom, was easily removed by the use of a metal spatula or a knife. There were observed almost no flaws caused by the use of the spatula or the knife on the nickel-phosphorus alloy plating layer as the lower layer.

EXAMPLE 8

A plated metal sheet identical with the sample of the present invention No. 7 was heated at a temperature of 360° C. for one hour to melt the fluorocarbon polymer particles which were exposed on the surface of each of the composite nickel-boron alloy plating layers as the upper layers to form a fluorocarbon polymer layer having an average thickness of 0.1 μm on each of the composite nickel-boron alloy plating layers as the upper layers, thereby preparing a sample of the present invention No. 8.

Regarding the sample of the present invention No. 8, the following fact was further observed in addition to the above-mentioned facts (i) to (iii) and (v) to (vii) as observed in the sample of the present invention No. 7: The nickel-phosphorus alloy plating layer as the lower layer had a Vickers hardness of 1,000 Hv.

It was confirmed that the nickel-phosphorus alloy plating layer as the lower layer of the sample of the present invention No. 8 had a Vickers hardness of 1,000 Hv as described above, because the Ni$_3$P particles were uniformly precipitated in the nickel-phosphorus alloy plating layer as the lower layer under the effect of the above-mentioned heat treatment.

Then, the sample of the present invention No. 8 was tested for strippability in the same manner as in the sample of the present invention No. 1. As a result, the epoxy resin adhering onto the surface of the sample of the present invention No. 8 was totally stripped off very easily from the surface of the sample of the present invention No. 8 without the use of a metal spatula or a knife.

EXAMPLE FOR COMPARISON 1

A sheet of the same steel as that in Example 1 was subjected to a known degreasing treatment and a known pickling treatment to remove rust from the both surfaces thereof. Then, after the removal of rust, the steel sheet was electroplated under the following conditions:

| (a) | Chemical composition of composite metal electroplating bath: | |
|---|---|---|
| | Nickel sulfamate | 500 g/l, |
| | Nickel chloride | 45 g/l, |
| | Boric acid | 35 g/l, |
| | Polytetrafluoroethylene particles (average particle size: 0.2 μm) as fluorocarbon polymer particles | 50 g/l, |
| (b) | Electric current density | 1.5 A/dm$^2$, |
| (c) | Bath temperature | 40° C., |
| (d) | pH value | 4.2, |
| (e) | Electroplating time | 10 minutes, | to form, on each of the both surfaces of the steel sheet, a composite nickel plating layer as a single layer, having an average thickness of 5 μm, in which the fluorocarbon polymer particles were uniformly dispersed, thereby preparing a sample for comparison No. 1 outside the scope of the present invention.

Regarding the sample for comparison No. 1, the following facts were observed:

(i) A satisfactory adhesion was ensured between the steel sheet and the composite nickel plating layer as the single layer;

(ii) The composite nickel plating layer as the single layer had a content of the fluorocarbon polymer particles of 30 vol. % relative to the composite nickel plating layer as the single layer; and (iii) The composite nickel plating layer as the single layer had a Vickers hardness of 200 Hv.

Then, the sample for comparison No. 1 was tested for strippability in the same manner as in the sample of the present invention No. 1. Since the sample for comparison No. 1 had no nickel-phosphorus alloy plating layer as a lower layer of the present invention, the sample for comparison No. 1 had the following problem: Although part of the epoxy resin still remaining on the surface of the sample for comparison No. 1 without being stripped off therefrom, was easily removed by the use of a metal spatula or a knife, flaws caused by the spatula of the knife were observed on the composite nickel plating layer as the single layer, and those flaws reached even the steel sheet.

EXAMPLE FOR COMPARISON 2

A sheet of the same steel as that in Example 1 was subjected to a known degreasing treatment and a known pickling treatment to remove rust from the both surfaces thereof. Then, after the removal of rust, the steel sheet was electroplated under the same conditions as the plating conditions in Example 1 to form, on each of the both surfaces of the steel sheet, a nickel-phosphorus alloy plating layer as a lower layer identical with that in Example 1.

Then, the steel sheet having the nickel-phosphorus alloy plating layer as the lower layer thus formed on each of the both surfaces thereof, was electroplated under the same conditions as the plating conditions in Example 1, except for a content of the fluorocarbon polymer particles of 0.5 g/l in the composite metal electroplating bath, to form, on the nickel-phosphorus alloy plating layer as the lower layer formed on each of the both surfaces of the steel sheet, a composite nickel plating layer as an upper layer, having an average thickness of 5 μm in which the fluorocarbon polymer particles were uniformly dispersed, thereby preparing a sample for comparison No. 2 outside the scope of the present invention.

Regarding the sample for comparison No. 2, the following facts were observed:

(i) A satisfactory adhesion was ensured between the steel sheet and the nickel-phosphorus alloy plating layer as the lower layer, and between the nickel-phosphorus alloy plating layer as the lower layer and the composite nickel plating layer as the upper layer;

(ii) Since the composite metal electroplating bath for forming the composite nickel plating layer as the upper layer had only a low content of the fluorocarbon polymer particles, the composite nickel plating layer as the upper layer had a low content of the fluorocarbon polymer particles of 0.4 vol. % relative to the composite nickel plating layer as the upper layer, which was outside the scope of the present invention;

(iii) The nickel-phosphorus alloy plating layer as the lower layer had a Vickers hardness of 700 Hv; and (iv) The composite nickel plating layer as the upper layer had a Vickers hardness of 250 Hv.

Then, the sample for comparison No. 2 was tested for strippability in the same manner as in the sample of the present invention No. 1. Since the composite nickel plating layer as the upper layer of the sample for comparison No. 2 had a low content of the fluorocarbon polymer particles of 0.4 vol. % relative to the composite nickel plating layer as the upper layer, which was outside the scope of the present invention, the sample for comparison No. 2 had the following problem: It was very difficult to remove the epoxy resin adhering onto the surface of the sample for comparison No. 2 even with the use of a metal spatula or a knife.

EXAMPLE FOR COMPARISON 3

A sheet of the same steel as that in Example 1 was subjected to a known degreasing treatment and a known pickling treatment to remove rust from the both surfaces thereof. Then, after the removal of rust, the steel sheet was electroplated under the same conditions as the plating conditions in Example 1 to form, on each of the both surfaces of the steel sheet, a nickel-phosphorus alloy plating layer as a lower layer identical with that in Example 1.

Then, the steel sheet having the nickel-phosphorus alloy plating layer as the lower layer thus formed on each of the both surfaces thereof, was electroplated under the same conditions as the plating conditions in Example 1, except for a content of the fluorocarbon polymer particles of 70 g/l in the composite metal electroplating bath, to form, on the nickel-phosphorus alloy plating layer as the lower layer formed on each of the both surfaces of the steel sheet, a composite nickel plating layer as an upper layer, having an average thickness of 5 μm, in which the fluorocarbon polymer particles were uniformly dispersed, thereby preparing a sample for comparison No. 3 outside the scope of the present invention.

Regarding the sample for comparison No. 3, the following facts were observed:

(i) Although a satisfactory adhesion was ensured between the steel sheet and the nickel-phosphorus alloy plating layer as the lower layer, adhesion was poor between the nickel-phosphorus alloy plating layer as the lower layer and the composite nickel plating layer as the upper layer, because the composite metal electroplating bath for forming the composite nickel plating layer as the upper layer had a very high content of the fluorocarbon polymer particles;

(ii) The nickel-phosphorus alloy plating layer as the lower layer had a Vickers hardness of 700 Hv;

(iii) Since the composite metal electroplating bath for forming the composite nickel plating layer as the upper layer had a very high content of the fluorocarbon polymer particles, the composite nickel plating layer as the upper layer had a high content of the fluorocarbon polymer particles of 62 vol. % relative to the composite nickel plating layer as the upper layer, which was outside the scope of the present invention; and (iv) The composite nickel plating layer as the upper layer had a Vickers hardness of 150 Hv.

Since, in the sample for comparison No. 3, adhesion was poor between the nickel-phosphorus alloy plating layer as the lower layer and the composite nickel plating layer as the upper layer, the composite nickel plating layer as the upper layer was easily stripped off from the nickel-phosphorus alloy plating layer as the lower layer. The sample for comparison No. 3 was therefore unsuitable as a separating sheet to be used when manufacturing a printed circuit board by the use of a hot press.

EXAMPLE FOR COMPARISON 4

A sheet of the same steel as that in Example 1 was subjected to a known degreasing treatment and a known pickling treatment to remove rust from the both surfaces thereof. Then, after the removal of rust, the steel sheet was electroplated under the following conditions:

| (1) Chemical composition of nickel alloy electroplating bath: | |
|---|---|
| Nickel sulfate | 240 g/l, |
| Nickel chloride | 45 g/l, |
| Boric acid | 30 g/l, and |
| Phosphorous acid | 1 g/l, |
| (2) Electric current density | 1.5 A/dm$^2$, |
| (3) Bath temperature | 60° C., |
| (4) pH value | 2.0, |
| (5) Electroplating time | 30 minutes, | to form, on each of the both surfaces of the steel sheet, a nickel-phosphorus alloy plating layer as a lower layer, having an average thickness of 10 μm.

Then, the steel sheet having the nickel-phosphorus alloy plating layer as the lower layer thus formed on each of the both surfaces thereof, was electroplated under the same conditions as the plating conditions in Example 1 to form, on the nickel-phosphorus alloy plating layer as the lower layer formed on each of the both surfaces of the steel sheet, a composite nickel plating layer as an upper layer, identical with that in Example 1, having an average thickness of 5 μm, in which the fluorocarbon polymer particles were uniformly dispersed, thereby preparing a sample for comparison No. 4 outside the scope of the present invention.

Regarding the sample for comparison No. 4, the following facts were observed:

(i) A satisfactory adhesion was ensured between the steel sheet and the nickel-phosphorus alloy plating layer as the lower layer, and between the nickel-phosphorus alloy plating layer as the lower layer and the composite nickel plating layer as the upper layer; and (ii) Since the nickel alloy electroplating bath for forming the nickel-phosphorus alloy plating layer as the lower layer had a very low phosphorus acid content, the nickel-phosphorus alloy plating layer as the lower layer had a low phosphorus content of 0.5 wt. % relative to the nickel-phosphorus alloy plating layer as the lower layer, which was outside the scope of the present invention. As a result, the nickel-phosphorus alloy plating layer as the lower layer had a low Vickers hardness of 300 Hv, which was outside the scope of the present invention.

Then, the sample for comparison No. 4 was tested for strippability in the same manner as in the sample of the present invention No. 1. As a result, the sample for comparison No. 4 had the following problem: Most of the epoxy resin adhering onto the surface of the sample for comparison No. 4 was very easily stripped off therefrom without the use of a metal spatula or a knife. Part of the epoxy resin still remaining onto the surface of the sample for comparison No. 4 without being stripped off therefrom, was easily removed by the use of a metal spatula or a knife. However, there were observed flaws caused by the use of the spatula of the knife on the composite nickel plating layer as the upper layer and the nickel-phosphorus alloy plating layer as the lower layer, and those flaws reached even the steel sheet.

EXAMPLE FOR COMPARISON 5

A sheet of the same steel as that in Example 1 was subjected to a known degreasing treatment and a known pickling treatment to remove rust from the both surfaces thereof. Then, after the removal of rust, the steel sheet was electroplated under the following conditions;

| (1) Chemical composition of nickel alloy electroplating bath: | |
|---|---|
| Nickel sulfate | 240 g/l, |
| Nickel chloride | 45 g/l, |
| Boric acid | 30 g/l, and |
| Phosphorous acid | 70 g/l, |
| (2) Electric current density | 1.5 A/dm$^2$, |
| (3) Bath temperature | 60° C., |
| (4) pH value | 2.0, |
| (5) Electroplating time | 30 minutes, | to form, on each of the both surfaces of the steel sheet, a nickel-phosphorus alloy plating layer as a lower layer, having an average thickness of 10 μm.

Then, the steel sheet having the nickel-phosphorus alloy plating layer as the lower layer thus formed on each of the both surfaces thereof, was electroplated under the same conditions as the plating conditions in Example 1 to form, on the nickel-phosphorus alloy plating layer as the lower layer formed on each of the both surfaces of the steel sheet, a composite nickel plating layer as an upper layer, identical with that in Example 1, having an average thickness of 5 μm, in which the fluorocarbon polymer particles were uniformly dispersed, thereby preparing a sample for comparison No. 5 outside the scope of the present invention.

Regarding the sample for comparison No. 5, the following facts were observed:

(i) A satisfactory adhesion was ensured between the steel sheet and the nickel-phosphorus alloy plating layer as the lower layer, and between the nickel-phosphorus alloy plating layer as the lower layer and the composite nickel plating layer as the upper layer; and (ii) Since the nickel alloy electroplating bath for forming the nickel-phosphorus alloy plating layer as the lower layer had a very high phosphorus acid content, the nickel-phosphorus alloy plating layer as the lower layer had a high phosphorus content of 20 wt. % relative to the nickel-phosphorus alloy plating layer as the lower layer, which was outside the scope of the present invention. As a result, the nickel-phosphorus alloy plating layer as the lower layer had cracks.

Since the nickel-phosphorus alloy plating layer as the lower layer of the sample for comparison No. 5 had cracks as described above, the sample for comparison No. 5 was unsuitable as a separating sheet to be used when manufacturing a printed circuit board by the use of a hot press.

EXAMPLE FOR COMPARISON 6

A sheet of the same stainless steel as that in Example 5 was subjected to a known degreasing treatment and a known electrolytic pickling treatment, and furthermore, to a nickel strike plating as a pretreatment in a nickel chloride plating bath. Then, the thus pretreated stainless steel sheet was dip-plated under the following conditions:

| (1) Chemical composition of nickel alloy dip-plating bath: | |
|---|---|
| Nickel sulfate | 30 g/l, |
| Sodium citrate | 20 g/l, |
| Sodium hydroxide | 40 g/l, and |
| Sodium boronhydride | 0.1 g/l, |
| (2) Bath temperature | 90° C., |
| (3) pH value | 14, |
| (4) Dip-plating time | 30 minutes, | to form, on each of the both surfaces of the stainless steel sheet, a nickel-boron alloy plating layer as a lower layer, having an average thickness of 5 μm.

Then, the stainless steel sheet having the nickel-boron alloy plating layer as the lower layer thus formed on each of the both surfaces thereof, was electroplated under the same conditions as the plating conditions in Example 5 to form, on the nickel-boron alloy plating layer as the lower layer formed on each of the both surfaces of the stainless steel sheet, a composite nickel plating layer as an upper layer identical with that in Example 5, having an average thickness of 5 μm, in which the fluorocarbon polymer particles were uniformly dispersed, thereby preparing a sample for comparison No. 6 outside the scope of the present invention.

Regarding the sample for comparison No. 6, the following facts were observed:

(i) A satisfactory adhesion was ensured between the stainless steel sheet and the nickel-boron alloy plating layer as the lower layer, and between the nickel-boron alloy plating layer as the lower layer and the composite nickel plating layer as the upper layer; and (ii) Since the nickel alloy dip-plating bath for forming the nickel-boron alloy plating layer as the lower layer had a very low sodium borohydride content, the nickel-boron alloy plating layer as the lower layer had a low boron content of 0.5 wt. % relative to the nickel-boron alloy plating layer as the lower layer, which was outside the scope of the present invention. As a result, the nickel-boron alloy plating layer as the lower layer had a low Vickers hardness of 300 Hv, which was outside the scope of the present invention.

Then, the sample for comparison No. 6 was tested for strippability in the same manner as in the sample of the present invention No. 1. As a result, the sample for comparison No. 6 had the following surface of the sample for comparison No. 6 was very easily stripped off therefrom without the use of a metal spatula or a knife. Part of the epoxy resin still adhering onto the surface of the sample for comparison No. 6 without being stripped off therefrom, was easily removed by the use of a metal spatula or a knife. However, there were observed flaws caused by the use of the spatula or the knife on the composite nickel plating layer as the upper layer and the nickel-boron alloy plating layer as the lower layer, and those flaws reached even the stainless steel.

EXAMPLE FOR COMPARISON 7

A sheet of the same stainless steel as that in Example 5 was subjected to a known degreasing treatment and a known electrolytic pickling treatment, and furthermore, to a nickel strike plating as a pretreatment in a nickel chloride plating bath. Then, the thus pretreated stainless steel sheet was dip-plated under the following conditions:

| (1) Chemical composition of nickel alloy dip-plating bath: | |
|---|---|
| Nickel sulfate | 30 g/l, |
| Sodium citrate | 20 g/l, |
| Sodium hydroxide | 40 g/l, and |
| Sodium boronhydride | 5 g/l, |
| (2) Bath temperature | 90° C., |
| (3) pH value | 14, |
| (4) Dip-plating time | 30 minutes, | to form, on each of the both surfaces of the stainless steel sheet, a nickel-boron alloy plating layer as a lower layer, having an average thickness of 5 μm.

Then, the stainless steel sheet having the nickel-boron alloy plating layer as the lower layer thus formed on each of the both surfaces thereof, was electroplated under the same conditions as the plating conditions in Example 5 to form, on the nickel-boron alloy plating layer as the lower layer formed on each of the both surfaces of the stainless steel sheet, a composite nickel plating layer as an upper layer, identical with that in Example 5, having an average thickness of 5 μm, in which the fluorocarbon polymer particles were uniformly dispersed, thereby preparing a sample for comparison No. 7 outside the scope of the present invention.

Regarding the sample for comparison No. 7, the following facts were observed:

(i) A satisfactory adhesion was ensured between the stainless steel sheet and the nickel-boron alloy plating layer as the lower layer, and between the nickel-boron alloy plating layer as the lower layer and the composite nickel plating layer as the upper layer; and (ii) Since the nickel alloy dip-plating bath for forming the nickel-boron alloy plating layer as the lower layer had a very high sodium borohydride content, the nickel-boron alloy plating layer as the lower layer had a high boron content of 18 wt. % relative to the nickel-boron alloy plating layer as the lower layer, which was outside the scope of the present invention. As a result, the nickel-boron alloy plating layer as the lower layer had cracks.

Since the nickel-boron alloy plating layer as the lower layer of the sample for comparison No. 7 had cracks as described above, the sample for comparison No. 7 was unsuitable as a separating sheet to be used when manufacturing a printed circuit board by the use of a hot press.

According to the present invention, as described above in detail, it is possible to obtain a plated metal sheet provided with a plurality of plating layers, excellent in strippability and having a high hardness, which is most suitable as a separating sheet to be used when manufacturing a printed circuit board by the use of a hot press, thus providing many industrially useful effects.

What is claimed is:

1. A separating sheet provided with a plurality of plating layers, excellent in strippability and having a high hardness, which is to be used when manufacturing a printed circuit board by the use of a hot press, and which comprises:

a metal sheet;
   a nickel alloy plating layer as a lower layer, having a Vickers hardness of at least 500 Hv, formed on at least one surface of said metal sheet; and
   a composite metal plating layer as an upper layer, in which fluorocarbon polymer particles are uniformly dispersed, formed on said nickel alloy plating layer as the lower layer, a content of said fluorocarbon polymer particles in said composite metal plating layer as the upper layer being within a range of from 1 to 50 vol. % relative to said composite metal plating layer as the upper layer, and said composite metal plating layer as the upper layer having an average thickness within a range of from 0.5 to 20 μm.

2. A separating sheet as claimed in claim 1, wherein: said composite metal plating layer as the upper layer has thereon a fluorocarbon polymer layer formed by melting said fluorocarbon polymer particles which are exposed on the surface of said composite metal plating layer as the upper layer.

3. A plated metal sheet as claimed in claim 1 or 2, wherein:
   said metal sheet comprises any one of steel and an aluminum alloy.

4. A separating sheet as claimed in claim 3, wherein:
   said nickel alloy plating layer as the lower layer has an average thickness within a range of from 0.1 to 100 μm;
   said nickel alloy plating layer as the lower layer comprises a nickel-phosphorus alloy containing from 1 to 15 wt % phosphorus or a nickel-boron alloy containing from 1 to 15 wt % boron;
   said fluorocarbon polymer particles in said composite metal plating layer as the upper layer have an average particle size within a range of from 0.01 to 10 μm; and
   said composite metal plating layer as the upper layer comprises a metal selected from the group consisting of nickel, cobalt, chromium, zinc, copper and tin or an alloy of said metal.

5. A separating sheet as claimed in claim 4, wherein:
   said nickel alloy plating layer as the lower layer has an average thickness within a range of from 1 to 20 μm; and
   said fluorocarbon polymer particles in said composite metal plating layer as the upper layer comprises have a particle size within a range of from 0.05 to 0.3 μm. wt % phosphorus or a nickel-boron alloy containing from 1 to 15 wt % boron;

6. A separating sheet as claimed in claim 5, wherein:
   said composite metal plating layer as the upper layer comprises a nickel-phosphorus alloy.

7. A separating sheet as claimed in claim 5, wherein:
   said composite metal plating layer as the upper layer comprises a nickel-boron alloy.

8. A separating sheet as claimed in claim 1 or 2, wherein:
   said nickel alloy plating layer as the lower layer has an average thickness within a range of from 0.1 to 100 μm.

9. A separating sheet as claimed in claim 8, wherein:
   said nickel alloy plating layer as the lower layer has an average thickness within a range of from 1 to 20 μm.

10. A separating sheet as claimed in claim 1 or 2, wherein:
    said nickel alloy plating layer as the lower layer comprises a nickel-phosphorus alloy.

11. A separating sheet as claimed in claim 10, wherein:
    a phosphorus content in said nickel alloy plating layer as the lower layer, which comprises the nickel-phosphorus alloy, is within a range of from 1 to 15 wt. % relative to said nickel alloy plating layer as the lower layer.

12. A separating sheet as claimed in claim 1 or 2, wherein:
    said nickel alloy plating layer as the lower layer comprises a nickel-boron alloy.

13. A separating sheet as claimed in claim 12, wherein:
    a boron content in said nickel alloy plating layer as the lower layer, which comprises the nickel-boron alloy, is within a range of from 1 to 15 wt. % relative to said nickel alloy plating layer as the lower layer.

14. A separating sheet as claimed in claim 1 or 2, wherein:
    said fluorocarbon polymer particles in said composite metal plating layer as the upper layer have an average particle size within a range of from 0.01 to 10 μm.

15. A separating sheet as claimed in claim 14, wherein:
    said fluorocarbon polymer particles in said composite metal plating layer as the upper layer have an average particle size within a range of from 0.05 to under 0.3 μm.

16. A separating sheet as claimed in claim 1 or 2, wherein:
    said composite metal plating layer as the upper layer comprises a metal selected from the group consisting of nickel, cobalt, chromium, zinc, copper and tin.

17. A separating sheet as claimed in claim 1 or 2, wherein:
said composite metal plating layer as the upper layer comprises an alloy of a metal selected from the group consisting of nickel, cobalt, chromium, zinc, copper and tin.

18. A separating sheet as claimed in claim 17, wherein:
said composite metal plating layer as the upper layer comprises a nickel-phosphorus alloy.

19. A separating sheet as claimed in claim 17, wherein:
said composite metal plating layer as the upper layer comprises a nickel-boron alloy.

* * * * *